United States Patent

Collard et al.

[15] 3,665,254

[45] May 23, 1972

[54] SEMICONDUCTOR DIODE

[72] Inventors: Jacques Roger Collard, Trenton; Subrahmanyam Yegna Narayan, Cranbury; John Paul Paczkowski, Scotch Plains, all of N.J.

[73] Assignee: RCA Corporation

[22] Filed: Oct. 12, 1970

[21] Appl. No.: 79,981

[52] U.S. Cl. ....................317/234 R, 317/234 A, 317/234 N, 317/235 UA

[51] Int. Cl. ..........................................H01l 3/00, H01l 5/00

[58] Field of Search ........................317/234, 235, 5, 5.3, 5.4, 317/31; 29/589

[56] References Cited

UNITED STATES PATENTS

| | | | |
|---|---|---|---|
| 3,446,912 | 5/1969 | Diehl et al. | 317/234 N |
| 3,558,992 | 1/1971 | Heuner et al. | 317/234 N |
| 3,560,812 | 2/1971 | Hall | 317/235 U |
| 3,562,040 | 2/1971 | Garies | 317/234 M |
| 3,567,506 | 3/1971 | Belardi | 317/235 N |
| 3,569,796 | 3/1971 | Mulford | 317/234 M |

*Primary Examiner*—John W. Huckert
*Assistant Examiner*—Andrew J. James
*Attorney*—Glenn H. Bruestle

[57] ABSTRACT

A Schottky surface barrier junction diode in which a metal layer is provided over a surface of a body of semiconductor material. The metal layer has a first portion which is in contact with the surface of the body to form the Schottky surface barrier junction, and a second portion which is spaced from the surface of the body. A bonding layer is provided between the second portion of the metal layer and the surface of the body and mechanically secures the metal layer to the body. A terminal lead is in contact with the metal layer and is bonded only to the second portion of the metal layer so that the terminal lead is mechanically secured to the body without disrupting the Schottky surface barrier junction.

4 Claims, 2 Drawing Figures

INVENTORS
Jacques R. Collard,
Subrahmanyam Y. Narayan
& John P. Paczkowski

BY Donald S. Chen
ATTORNEY

SEMICONDUCTOR DIODE

BACKGROUND OF THE INVENTION

The invention herein described was made in the course of or under a contract or subcontract thereunder with the Department of the Army.

The present invention relates to a semiconductor diode, and more particularly to a surface barrier junction type semiconductor diode.

Surface barrier junction type semiconductor diodes, generally referred to as Schottky barrier diodes, comprise a body of a semiconductor material, such as silicon, germanium or gallium arsenide, and a metal layer on a surface of the body forming a surface barrier junction with the body. A problem which has arisen in the manufacture of such diodes is that some of the metals which are suitable for forming surface barrier junction with the semiconductor body have poor mechanical adhesion with the body. Thus, when a terminal lead is secured to the metal layer so as to make electrical connections to the metal layer, the process used to bond the terminal wire to the metal layer often breaks the mechanical bond between the metal layer and the semiconductor body and destroys the diode. Conventional method of improving the mechanical bond between the metal layer and the semiconductor body, such as heating cannot be used since such methods destroy the surface barrier junction.

SUMMARY OF THE INVENTION

A semiconductor device includes a body of semiconductor material and a metal layer on the body. A first portion of the metal layer contacts a surface of the body and forms a surface barrier rectifying junction with the body. A bonding layer is provided between a second portion of the metal layer and the body and mechanically secures the metal layer to the body.

DETAILED DESCRIPTION

Figure 1:
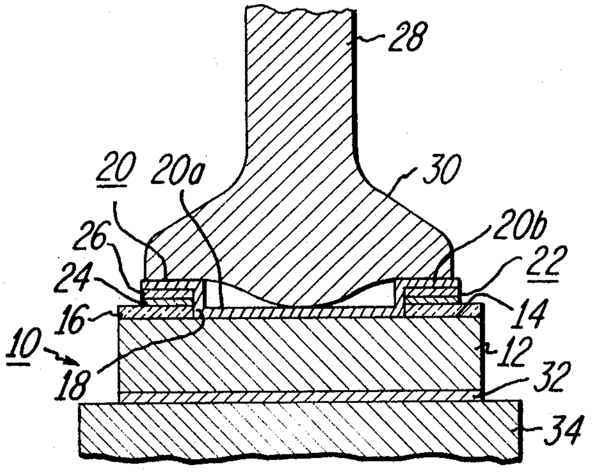
FIG. 1 is a sectional view of one form of the semiconductor diode of the present invention.
Figure 2:
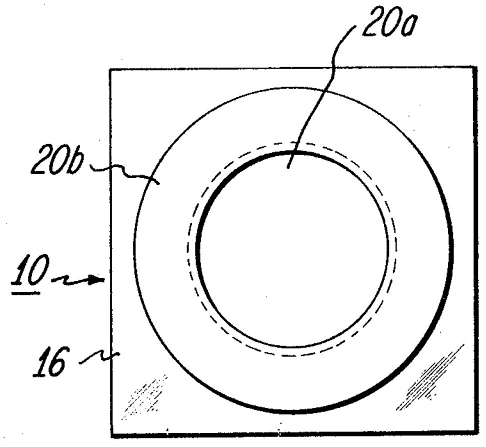
FIG. 2 is a top plan view of the diode of FIG. 1 with the terminal lead removed.

Referring to the drawing, a form of the semiconductor diode of the present invention is generally designated as 10. The diode 10 comprises a body 12 of a semiconductor material, such as silicon germanium, gallium arsenide or other known semiconductor materials, having a flat surface 14. A layer 16 of an electrical insulating material, such as silicon dioxide, or a multi-layer of silicon dioxide over silicon nitride, is on the surface 14 of the body 12. The insulating material layer 16 has a circular opening 18 therethrough to the surface 14. A metal layer 20 extends over the surface 14 of the body 12. The metal layer 20 has a first portion **20*a* which extends over and contacts the portion of the body surface 14 which is within the opening 18 in the insulating layer 16, and a second peripheral portion 20*b* which extends over the insulating layer 16 around the edge of the opening 18. The metal layer is of any metal which will provide a Schottky surface barrier junction with the semiconductor material of the body 12, such as gold, nickel, aluminum, or platinum, so that the first portion 20*a* forms a Schottky surface barrier junction with the body 12**.

An annular bonding layer 22 is provided between and contacts the second portion **20*b* of the metal layer 20 and the insulating layer 16. As shown, the bonding layer 22 is two superimposed metal films 24 and 26. The metal film 24 is of a metal which has good adhesion to the insulating layer 16, such as chromium, platinum, titanium and aluminum. The metal film 26 is of a metal which has good adhesion to both the metal film 24 and the metal layer 20, such as gold or silver. Thus, the bonding layer 22 mechanically bonds the second portion 20*b* of the metal layer 20 to the insulating layer 16 which is adhered to the surface 14 of the body 12**.

A terminal lead 28 of an electrically conductive metal such as copper or gold, is connected to the metal film 20. The terminal lead 28 has on one end an enlarged, head 30 which contacts the metal layer 20 and is bonded only to the second portion **20*b* of the metal layer 20 over the bonding layer 22. The terminal head lead 30 can be bonded to the second portion 20*b* of the metal layer 20 by any suitable low temperature bonding technique, such as by low temperature thermocompression bonding or ultrasonic bonding. Since the second portion 20*b* of the metal layer 20 is strongly adhered to the body 12 through the bonding layer 22 and the insulating layer 16, the terminal lead 28 is strongly bonded to the body 12. During the bonding of the terminal head 30 to the metal layer 20 pressure is applied only to the periphery of the head over the second portion 20*b* of the metal film to achieve the bond between the terminal head and the metal layer. Since the terminal lead 28 is not pressed against the first portion 20*a* of the metal layer 20, which may have poor adhesion to the body 12, the bonding of the terminal lead to the metal layer will not destroy the contact between the first portion 20*a* of the metal layer and the body 12, and this will not adversely affect the surface barrier junction. Instead of a headed wire terminal lead, the terminal lead can be a metal strap having an end portion extending over the metal film 20 substantially parallel to the surface 14 of the body 12 and bonded to the second portion 20*b*** of the metal film.

A thin contact layer 32 of an electrically conductive metal is coated on the other surface of the body 12 and is in ohmic contact with the body. A mounting stud 34 can be secured to the contact layer 32. The mounting stud 34 provides the electrical connection to one side of the surface barrier junction and the terminal lead 28 provides the electrical connection to the other side of the junction. Instead of the mounting stud 34, a second terminal lead can be secured to the contact layer 32.

Although the first portion **20*a* of the metal layer 20 is shown as being circular, it can be of any desired shape. Also, the second portion 20*b* of the metal layer 20 does not have to extend completely around the first portion 20*a* of the metal layer 20, but can extend from only a portion of the edge of the first portion 20*a*. Likewise, the bonding layer 22 does not have to extend completely around the edge of the opening 18 in the insulating layer 16 but only under enough of the second portion 20*b* of the metal layer so as to provide a strong bond between the second portion 20*b* and the body 12. Also, if the metal layer 24 of the bonding layer 22 is of a metal to which the metal of the metal layer 20 has good adherence, the second metal film 26 of the bonding layer 22** can be eliminated.

To make the semiconductor diode 12, the surface 14 of the body 12 is first completely coated with the layer 16 of the insulating material using any well known technique for coating the particular insulating material used. For example, a layer of silicon dioxide can be formed by exposing the surface to a mixture of silane and either oxygen or water vapor which are reacted at a temperature of between 200° C. and 400° C. to form silicon dioxide which deposits as a layer on the surface 14. The bonding layer 22 is then formed by coating the entire surface of the insulating layer 14 with the metal film or films of the bonding layer 22. The metal film or films of the bonding layer can be coated on the insulating layer 14 by the well known technique of evaporation in a vacuum. A masking layer of a resist material is then coated over the portion of the metal film or films which are to form the bonding layer 22 using standard photolithographic techniques. The uncoated portion of the metal film or films is then removed using an etchant suitable for the particular metal or metals of the metal film or films forms the bonding layer 22.

The opening 18 is then formed in the insulating layer 16 using an etchant suitable for the particular material of the insulating layer. If the bonding layer 22 extends completely around the opening 18 in the insulating layer 14, it can be used as a mask in etching the portion of the insulating layer within the bonding layer to form the opening 18. However, if the bonding layer 22 does not extend completely around the opening 18, a masking layer of a resist material can be coated over the insulating layer except for the portion where the opening 18 is to be provided.

The metal layer 20 is then coated on the body 12, such as by the well known technique of evaporation in a vacuum. This coats the metal layer 20 on the portion of the body surface 14 in the opening 18 in the insulating layer to form the Schottky surface barrier junction on the bonding layer 22 to provide the good mechanical bond between the metal layer 20 and the body 12, and on any portion of the insulating layer 16 not covered by the bonding layer 22. Since the electrical characteristics of the diode 10 is a function of the area of contact between the metal layer 20 and the body 12, any portion of the metal layer 20 on the insulating layer 16 does not have to be removed. However, to minimize any stray capacitance which may result between the metal layer 20 and the body 12 through the insulating layer 16, any portion of the metal layer 20 which is in contact with the insulating layer 16 can be removed. This can be achieved by coating a masking layer of a resist material over the first portion 20*a* and the second portion 20*b* of the metal layer 20 and etching away the uncovered portion of the metal layer 20 with an etchant suitable for the particular metal of the metal layer.

The contact layer 32 can be coated on the other surface of the body 12 by any suitable coating technique, such as evaporation in a vacuum. This can be done either at the same time that the bonding layer 22 is coated on the insulating layer 16 or at the same time that the metal layer 20 is coated on the body 12. However, if the contact layer 32 must be heated to provide an ohmic contact with the body 12, the contact layer 32 must be coated on the body 12 and heated prior to coating the metal layer 20 on the body. The terminal lead 28 is then bonded to the second portion 20*b* of the metal layer, and the mounting stud 34 bonded to the contact layer 32.

We claim:

1. A semiconductor diode comprising:

a. a body of semiconductor material, b. a metal layer on said body, a first portion of said metal layer contacting a surface of said body and forming a surface barrier rectifying junction with said body, c. a bonding layer between a second portion of said metal layer and said body, said bonding layer mechanically securing said metal layer to said body, and d. a metal terminal lead engaging said metal layer and bonded only to said second portion of the metal layer.

2. A semiconductor diode in accordance with claim 1 including a layer of an electrical insulating material on said surface of the body, said insulating layer having an opening therethrough to said surface of the body, the first portion of the metal layer contacting the surface of the body in the opening in the insulating layer, the second portion of the metal layer extending over the insulating layer, and the bonding layer being between the second portion of the metal layer and the insulating layer.

3. A semiconductor diode in accordance with claim 2 in which the bonding layer comprises at least one metal film.

4. A semiconductor diode in accordance with claim 3 in which the bonding layer comprises a pair of superimposed metal films, one of said metal films contacting and having good adherence to the insulating layer and the other of said metal films contacting and having good adherence to the insulating layer and the other of said metal films contacting and having good adherence to both the one metal film and the second of the metal layer.

* * * * *

UNITED STATES PATENT OFFICE
CERTIFICATE OF CORRECTION

Patent No. 3665254 Dated May 23, 1972

Inventor(s) Jacques Roger Collard, Subrahmanyam Yegna Narayan and John Paul Paczkowski It is certified that error appears in the above-identified patent and that said Letters Patent are hereby corrected as shown below:

In column 2, line 66, after "metals" insert --of the metal film or films. The remaining portion--.

Signed and sealed this 26th day of September 1972.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334